United States Patent
Hioka et al.

(10) Patent No.: US 9,945,912 B2
(45) Date of Patent: Apr. 17, 2018

(54) HALL SENSOR AND COMPENSATION METHOD FOR OFFSET CAUSED BY TEMPERATURE DISTRIBUTION IN HALL SENSOR

(71) Applicant: SEIKO INSTRUMENTS INC., Chiba-shi, Chiba (JP)

(72) Inventors: Takaaki Hioka, Chiba (JP); Masaru Akino, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 105 days.

(21) Appl. No.: 14/943,509

(22) Filed: Nov. 17, 2015

(65) Prior Publication Data
US 2016/0154066 A1 Jun. 2, 2016

(30) Foreign Application Priority Data

Nov. 27, 2014 (JP) .................................. 2014-240527

(51) Int. Cl.
*G01R 33/00* (2006.01)
*G01R 33/07* (2006.01)

(52) U.S. Cl.
CPC ....... *G01R 33/0017* (2013.01); *G01R 33/007* (2013.01); *G01R 33/07* (2013.01)

(58) Field of Classification Search
None
See application file for complete search history.

(56) References Cited

U.S. PATENT DOCUMENTS

| 6,639,290 B1 * | 10/2003 | Hohe | G01D 3/02 257/414 |
| 2008/0074106 A1 * | 3/2008 | Oohira | G01R 33/07 324/209 |
| 2008/0150522 A1 * | 6/2008 | Hikichi | G01R 33/07 324/251 |
| 2016/0131722 A1 * | 5/2016 | Ausserlechner | G01R 33/07 324/225 |
| 2016/0252589 A1 * | 9/2016 | Raman | G01R 33/0029 324/224 |

FOREIGN PATENT DOCUMENTS

JP 2013201229 A * 10/2013 ............. G01R 33/07
JP 2014066522 A * 4/2014

OTHER PUBLICATIONS

Abstract, Publication No. 06-186103, Publication Date Jul. 8, 1994.
Abstract, Publication No. 08-330646, Publication Date Dec. 13, 1996.

* cited by examiner

*Primary Examiner* — Jermele M Hollington
*Assistant Examiner* — Douglas X Rodriguez
(74) *Attorney, Agent, or Firm* — Bruce L. Adams

(57) ABSTRACT

In a Hall sensor in which a Hall element and elements serving as heat sources out of components of a circuit for driving the Hall element are arranged close to each other on a silicon substrate, two directions of control currents by spinning current for the Hall element are selected in a vector manner based on signals from temperature sensors arranged close to a periphery of the Hall element, thereby enabling the elimination of a magnetic offset caused by heat generation of the heat sources.

7 Claims, 4 Drawing Sheets

HALL SENSOR AND COMPENSATION METHOD FOR OFFSET CAUSED BY TEMPERATURE DISTRIBUTION IN HALL SENSOR

BACKGROUND OF THE INVENTION

1. Field of the Invention

The present invention relates to a semiconductor Hall element and a Hall sensor including a driving circuit for the semiconductor Hall element. In particular, the present invention relates to a Hall sensor capable of eliminating an offset voltage.

2. Description of the Related Art

At first the principle of detection of the presence of a magnetic field by a Hall element is described. When a magnetic field is applied perpendicularly to a current flowing through a substance, an electric field (Hall voltage) is generated in a direction perpendicular to both the current and the magnetic field. The principle of the magnetic detection by the Hall element is to acquire an intensity of the magnetic field based on a magnitude of the Hall voltage.

FIG. 3 is a diagram for illustrating the principle of an ideal Hall effect. On an ideal Hall element, a Hall voltage VH as an output from a voltmeter 3 is represented as:

$$VH = \mu B(W/L)Vdd$$

where W and L represent respectively a width and a length of a Hall element magnetism sensing portion 1, $\mu$ represents electron mobility, Vdd represents a voltage applied by a power supply 2 for supplying a current, and B represents an applied magnetic field. A coefficient proportional to the applied magnetic field B corresponds to the magnetic sensitivity, and hence a magnetic sensitivity Kh of this Hall element, is represented as:

$$Kh = \mu(W/L)Vdd$$

On the other hand, in an actual Hall element, an output voltage is generated even when no magnetic field is applied. The voltage output under a magnetic field of zero is called offset voltage. It is considered that the offset voltage is generated when potential distribution inside the element becomes imbalanced by, for example, mechanical stress applied to the element from the outside or misalignment occurring in a manufacturing process. For an actual application, compensation for the offset voltage is necessary to be regarded as 0 volt.

The compensation of the offset voltage is generally carried out by the following method.

FIG. 4 is a circuit diagram for illustrating the principle of an offset cancellation circuit utilizing spinning current. A Hall element 10 has a symmetrical shape and includes four terminals T1, T2, T3, and T4 so that a control current is caused to flow between one pair of input terminals and an output voltage is obtained between the other pair of output terminals. When one pair of the terminals T1 and T2 of the Hall element serve as control current input terminals, the other pair of the terminals T3 and T4 serve as Hall voltage output terminals. In this case, when a voltage Vin is applied to the input terminals, an output voltage Vh+Vos is generated between the output terminals, where Vh represents a Hall voltage proportional to a magnetic field generated by the Hall element and Vos represents an offset voltage. Next, with the terminals T3 and T4 serving as the control current input terminals and the terminals T1 and T2 serving as the Hall voltage output terminals, the input voltage Vin is applied between the terminals T3 and T4 to generate a voltage −Vh+Vos between the output terminals. Reference symbols S1 to S4 denote sensor terminal switching means, and one of terminals N1 and N2 is chosen by a switching signal generator 11.

By subtracting one output voltage from the other which are obtained by the currents flowing in two directions described above, the offset voltage Vos may be cancelled to obtain an output voltage 2Vh proportional to the magnetic field (see, for example, Japanese Patent Application Laid-open No. Hei 06-186103).

However, the offset voltage may not completely be cancelled by this offset cancellation circuit. A description is now given for the reason.

The Hall element is represented as an equivalent circuit illustrated in FIG. 5. In other words, the Hall element may be represented as a bridge circuit in which the four terminals are connected via four resistors R1, R2, R3, and R4. Based on this model, a description is given of the cancellation of the offset voltage by carrying out the subtraction between the output voltages which are obtained by the currents flowing in the two directions as described above.

When the voltage Vin is applied between the one pair of terminals T1 and T2 of the Hall element, the following Hall voltage is output between the other pair of terminals T3 and T4.

$$Vouta = (R2*R4 - R1*R3)/(R1+R4)/(R2+R3)* Vin$$

On the other hand, when the voltage Vin is applied between the terminals T3 and T4, the following Hall voltage is output between the terminals T1 and T2.

$$Voutb = (R1*R3 - R2*R4)/(R3+R4)/(R1+R2)*Vin$$

Then, the difference between the output voltages for the two directions is acquired as:

$$Vouta - Voutb = (R1-R3)*(R2-R4)*(R2*R4-R1*R3)/(R1+R4)/(R2+R3)/(R3+R4)/(R1+R2)*Vin$$

Thus, the offset voltage may be cancelled even when the respective resistors R1, R2, R3, and R4 of the equivalent circuit are different from each other, as long as R1=R3 or R2=R4. In this case, it is assumed that the respective resistances do not change even when the terminals to be applied with the voltage are changed. However, when this assumption is not satisfied, for example, even when R1=R3 for one direction but this relationship is not established for the other direction, the difference may not be made zero, and hence the offset may not be cancelled. A specific description is further given of one of reasons for the state in which the offset may not be cancelled by changing the application directions of the voltage.

The Hall element generally has such a structure that a peripheral portion of an N-type doped region to become the Hall element magnetism sensing portion is surrounded by a P-type impurity region for isolation. When a voltage is applied between the Hall current input terminals, a depletion layer expands at a boundary between the Hall element magnetism sensing portion and its peripheral portion. No Hall current flows in the depletion layer, and hence in a region of the expanding depletion layer, the Hall current is suppressed to increase the resistance. Further, the width of the depletion layer depends on the applied voltage. The resistances of the resistors R1, R2, R3, and R4 of the equivalent circuit illustrated in FIG. 5 are changed accordingly depending on the voltage application direction, and hence in some cases, the offset cancellation circuit may not cancel a magnetic offset.

There may be employed a method involving arranging depletion layer control electrodes around and above the element, and adjusting voltages applied to the respective electrodes, to thereby suppress the depletion layer from extending into the Hall element (see, for example, Japanese Patent Application Laid-open No. Hei 08-330646).

When the temperature in the Hall element 10 is not uniform, but has a distribution, the resistance in the Hall element 10 is not uniform, either, because the temperature is not uniform, resulting in locations low in the resistance and locations high in the resistance. On this occasion, the resistances of the resistors R1, R2, R3, and R4 have been changed by the temperature, and an attempt to cancel the offset by the spinning current thus fails.

Accordingly in a Hall sensor including a Hall element and an element serving as a heat source of a circuit for driving the Hall element, the offset voltage may not be eliminated by the spinning current method disclosed in Japanese Patent Application Laid-open No. 06-186103 since a temperature distribution is generated in the Hall element 10 due to the influence of heat generation.

Moreover, the resistances may be adjusted by the method disclosed in Japanese Patent Application Laid-open No. Hei 08-330646, but the method uses the plurality of the depletion layer control electrodes and requires a complex control circuit, and hence has such a problem that the chip size increases, which leads to an increase in cost.

SUMMARY OF THE INVENTION

In view of the above, the present invention has an object to provide a Hall sensor including elements serving as heat sources out of components of a circuit for driving a Hall element, and capable of cancelling an offset by spinning current even when a temperature distribution is generated in the Hall element due to the influence of heat generation without an increase in chip area caused by addition of a complex compensation circuit or enlarged separation between elements.

In order to solve the above-mentioned problem, one embodiment of the present invention employs the following structure.

In other words, a Hall sensor includes:

a semiconductor substrate;

a Hall element arranged on the semiconductor substrate, the Hall element having four axes of symmetry;

two pairs of terminals arranged on the Hall element, the two pairs of terminals serving both as control current input terminals and Hall voltage output terminals;

an element arranged on the semiconductor substrate around the Hall element, the element serving as a heat source; and a plurality of temperature sensors arranged on the semiconductor substrate outside the Hall element so as to have four axes of symmetry.

Through use of the above-mentioned-measures, in the Hall sensor including elements serving as the heat sources out of components of the circuit for driving the Hall element, even when a temperature distribution is generated in the Hall element due to the influence of the heat generation, the offset voltage may be eliminated by the spinning current.

Moreover, a Hall sensor is provided in which an offset voltage can be eliminated, the chip size can be reduced, and the cost can be suppressed since a complex circuit is not used and the distance between the heat source and the Hall element is not increased.

DETAILED DESCRIPTION OF THE EMBODIMENT

A detailed description is now given of an embodiment of the present invention with reference to the drawings.

Figure 1:
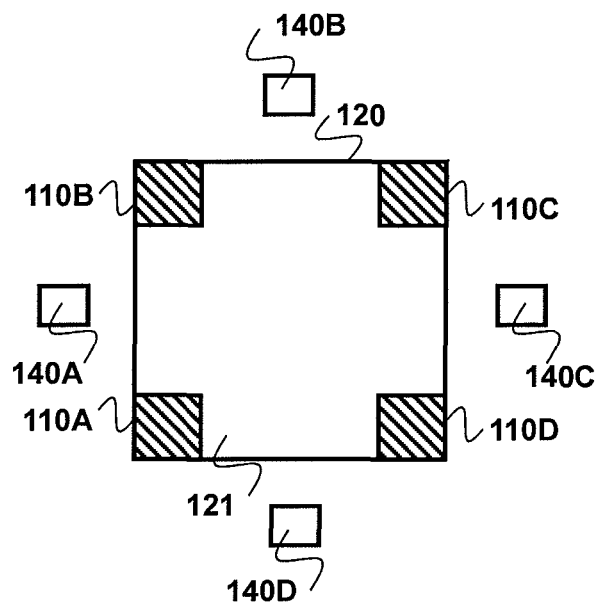
FIG. 1 is a plan view of a Hall sensor according to an embodiment of the present invention.

FIG. 1 is a plan view of a Hall sensor according to the embodiment of the present invention. The Hall sensor includes a Hall element for sensing magnetism and a circuit for driving or controlling the Hall element.

First, a description is given of a plan shape of the Hall element. As illustrated in FIG. 1, a Hall element 120 includes, on a semiconductor substrate, a magnetism sensing portion constructed by a square N-type doped region 121 and control current input terminals and Hall voltage output terminals 110A, 110B, 110C, and 110D constructed by N-type highly-doped regions having the same shape, which are arranged at respective vertices of the square magnetism sensing portion. The Hall element 120 is shaped into the square, resulting in a symmetrical Hall element having four axes of symmetry.

Further, temperature sensors 140A, 140B, 140C, and 140D are arranged around the Hall element. The temperature sensor may be constructed by a PN junction or a polysilicon resistor formed on the same substrate as the Hall element 120. As illustrated in FIG. 1, at least four temperature sensors are arranged around and close to the Hall element 120. In FIG. 1, each of the temperature sensors is arranged close to and outside a center portion of one of the sides of the Hall element 120. The positions at which each of the temperature sensors is arranged are not limited to the center portion of one of the sides of the Hall element 120 as illustrated in FIG. 1. The temperature sensor may be arranged close to each vertex of the Hall element 120, or a plurality of temperature sensors may be arranged close to each side. The arrangement is preferably symmetrical as in the Hall element.

Figure 2:
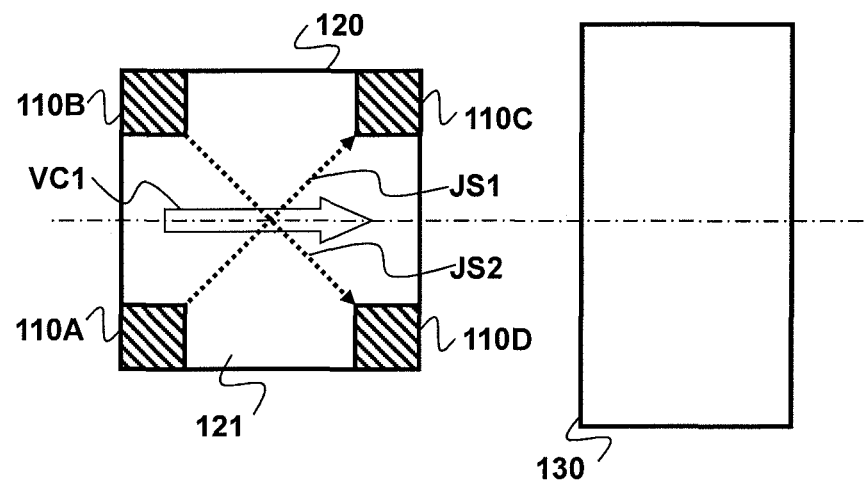
FIG. 2 is a diagram for illustrating a relationship between a position of one heat source and directions of currents caused to flow through the Hall element.
Figure 3:
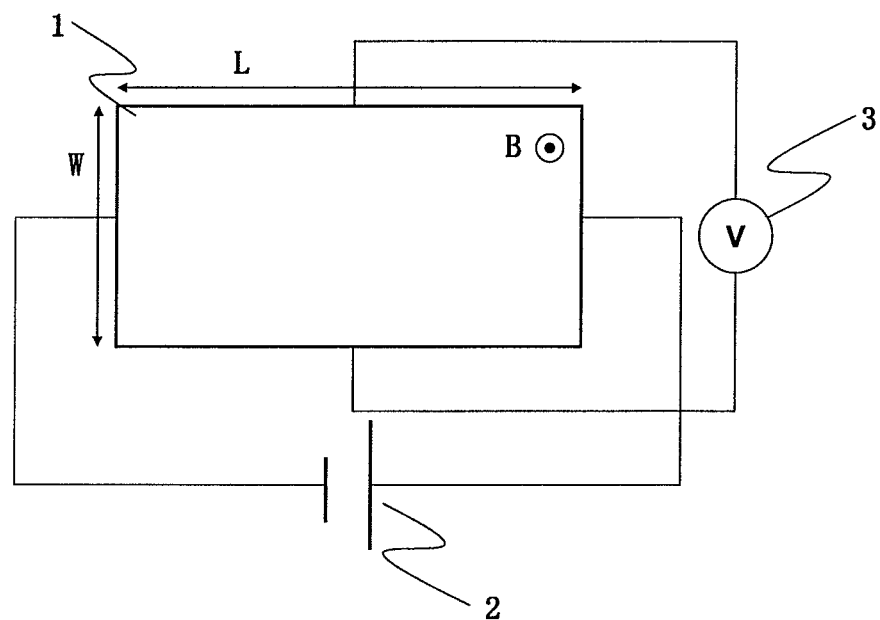
FIG. 3 is a diagram for illustrating the principle of an ideal Hall effect.

FIG. 2 is a diagram for illustrating a relationship between a position of one heat source and directions of currents caused to flow through the Hall element. Referring to FIG. 2, a description is given of the principle of setting the directions of currents caused to flow through the Hall element when the heat source exists.

A circuit for driving the Hall element 120 is arranged on the semiconductor substrate on which the Hall element 120 is formed. Then, it is further assumed that in this circuit, an element serving as a heat source 130 is arranged outside, but close to the Hall element. For example, when an internal circuit of the semiconductor Hall sensor uses not a power supply voltage, but an internal power supply voltage generated by using a voltage regulator to step down the power supply voltage, the voltage regulator may serve as the heat source. Moreover, for example, a resistor element through which a large current flows may serve as a heat source.

When the number of heat sources is one, as illustrated in FIG. 2, a center of the heat source 130 is aligned with an extension of a vector sum VC1 of currents JS1 and JS2 in two directions caused to flow through the Hall element 120 by the spinning current method. With this, the offset of the Hall element may be eliminated. A description is given later of why the offset may be eliminated. On this occasion, the center of the heat source means a point or a region having the highest temperature corresponding to a peak of isotherms drawn to represent a temperature gradient while the heat source is viewed from above.

Then, when a plurality of heat sources exist or a heat source moves depending on an operation condition, in order to enable the elimination of the offset by the spinning current method, first, temperatures around the Hall element 120 are measured by the plurality of temperature sensors. The offset may be eliminated as in the case of the single heat source described above by setting the currents in the two directions such that the vector sum VC1 of the currents JS1 and JS2 in the two directions caused to flow through the Hall element 120 by the spinning current method is parallel with a line connecting the maximum value and the minimum value out of the temperatures measured by the respective temperature sensors, namely, a direction in which the temperature gradient is the maximum in the measured values.

Based on an equivalent circuit, a description is now given of the principle of the elimination of the offset of the Hall element by the above-mentioned form.

Figure 4:
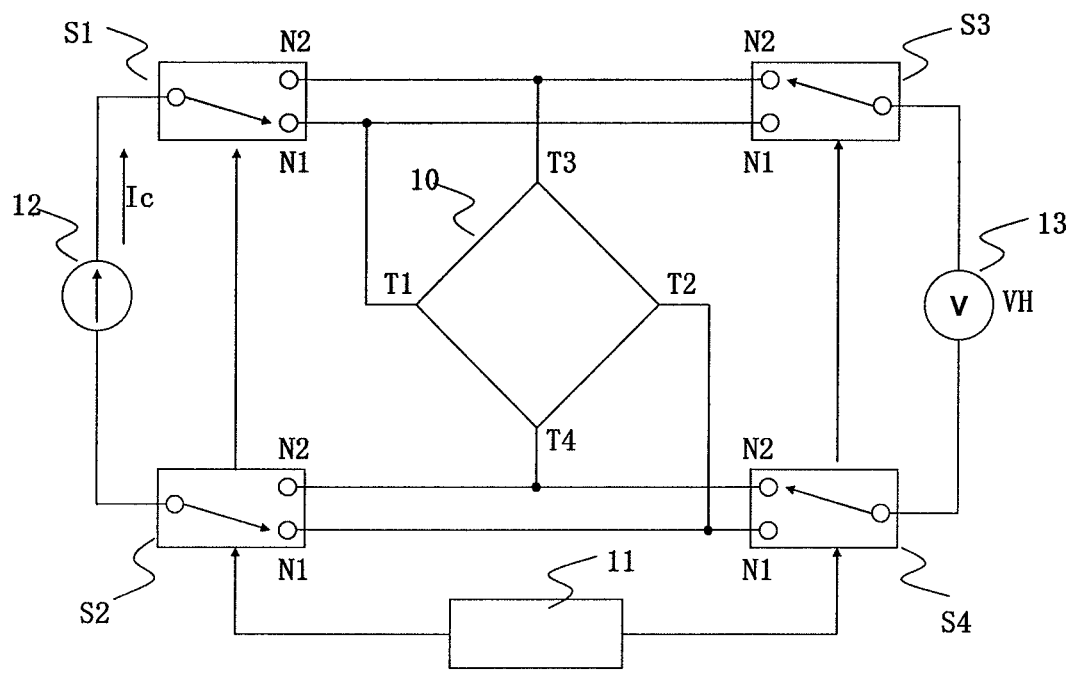
FIG. 4 is a diagram for illustrating a method of eliminating an offset voltage by spinning current.
Figure 5:
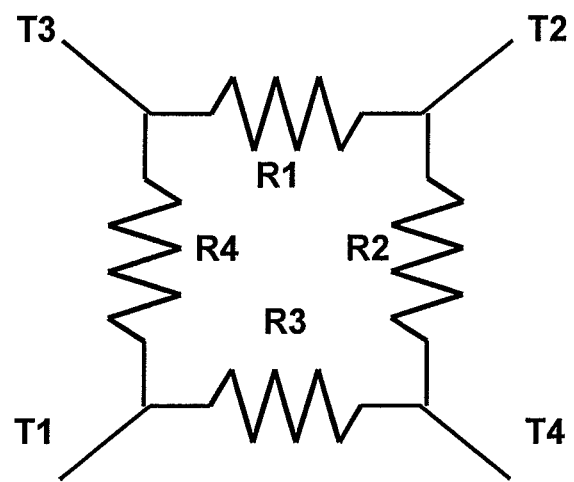
FIG. 5 is a diagram of an equivalent circuit, for illustrating an offset voltage of the Hall element.

The control current input terminals and Hall voltage output terminals 110A, 110B, 110C, and 110D constructed by the N-type highly-doped regions of the Hall element 120 of FIG. 1 are respectively connected to T1, T3, T2, and T4 of FIG. 4. In an equivalent circuit of FIG. 5, on this occasion, it is assumed that the relationship of R2=R4 is established when the temperature is the room temperature and the temperature gradient does not exist. The offset may thus be cancelled by the spinning current. When temperatures of respective resistors are different from one another, or a temperature gradient exists, then the respective resistances are different from one another. In other words, it is assumed that R2 becomes R2', and R4 becomes R4'. When a temperature gradient exists, the relationship of R2'≠R4' is generally established. Note that, R1≠R3 is established, and even when a temperature gradient is generated, R1'≠R3' is established.

A description is given while using the equations described above again. When the temperature is the room temperature, the temperature gradient does not exist, and a voltage Vin is applied between the one pair of terminals T1 and T2, the Hall element control current JS1 flows, and the following Hall voltage is output between the other pair of terminals T3 and T4.

Vout$a$=($R2*R4-R1*R3$)/($R1+R4$)/($R2+R3$)*Vin

On the other hand, when the voltage Vin is applied between the terminals T3 and T4, the current JS2 flows, and the following Hall voltage is output between the terminals T1 and T2.

Vout$b$=($R1*R3-R2*R4$)/($R3+R4$)/($R1+R2$)*Vin

On this occasion, when the difference between the output voltages in the two directions is directly acquired by the spinning current method, under the state in which the temperature gradient does not exist, the relationship of R2=R4 is established based on the assumption, and hence the offset voltage may be made zero in the following equation.

Vout$a$−Vout$b$=($R1-R3$)*($R2-R4$)*($R2*R4-R1*R3$)/($R1+R4$)/($R2+R3$)/($R3+R4$)/($R1+R2$)*Vin However, when a temperature gradient is generated, the resistances are different from each other, and R2 becomes R2' and R4 becomes R4'. The difference in the output voltage, accordingly, takes a value represented by the following equation, and may not be made zero.

Vout$a'$−Vout$b'$=($R1'-R3'$)*($R2'-R4'$)*($R2'*R4'-R1'*R3'$)/($R1'+R4'$)/($R2'+R3'$)/($R3'+R4'$)/($R1'+R2'$)*Vin However, by setting the positional relationship between the Hall element and the heat source such that the extension of the vector sum VC1 of the Hall element control currents JS1 and JS2 in the two directions by the spinning current method aligns with the center of the heat source 130 as illustrated in FIG. 2, even when the resistors R2 and R4 receive the influence of the heat generation to become R2' and R4', the resistors R2 and R4 are arranged so as to be symmetrical about the line along the vector sum VC1 of the Hall control currents JS1 and JS2 in the two directions, and hence the resistors R2 and R4 are on the same temperature gradient, and the relationship of R2'=R4' may be established while the relationship of R2=R4 is maintained.

Thus, the difference between the output voltages is represented as:

Vout=Vout$a'$−Vout$b'$=0 and the offset voltage may thus be eliminated by the spinning current.

Figure 6C:
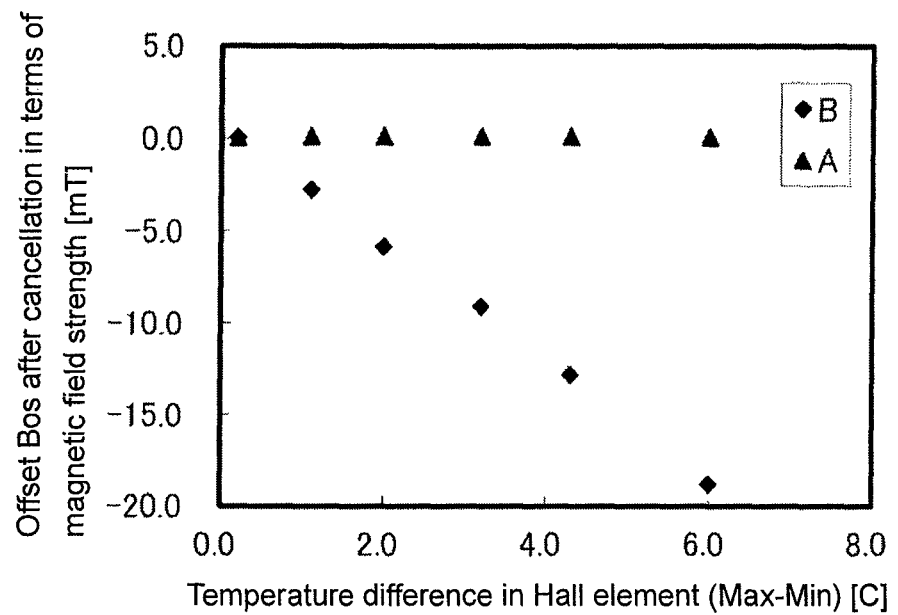
FIGS. 6A and 6B illustrate Hall element arrangements and FIG. 6C is a graph showing a relationship between offset voltages eliminated by the spinning current and a temperature distribution.
Figure 6A:
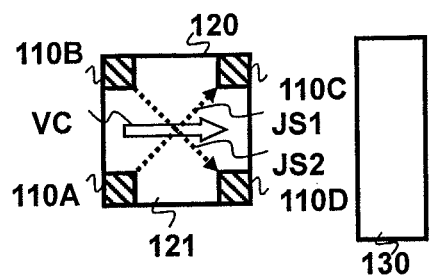
Figure 6B:
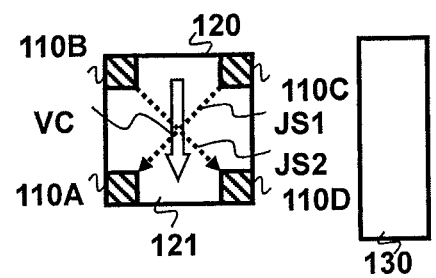

Moreover, FIG. 6C is an experiment diagram for illustrating the temperature difference between the maximum and the minimum in the Hall element of FIGS. 6A and 6B and offset values converted by magnetic field strength after the offset elimination by the spinning current. Legends A denote measurement results when an arrangement illustrated in FIG. 6A is used. Legends B denote measurement results when an arrangement illustrated in FIG. 6B is used, in which the heat source is arranged perpendicular to the Hall element control current vector sum VC1. Also from the measurement results of FIG. 6C, it is appreciated that the offsets may be eliminated by appropriately setting the positional relationship between the Hall element and the heat source.

Note that, the Hall element is not limited only to the square Hall element 120 illustrated in FIG. 1. The present invention may be applied as long as a Hall element similarly has symmetry and has four axes of symmetry, such as a Hall element including a cross-shaped magnetism sensing portion, and Hall current control electrodes and Hall voltage output terminals of N-type highly-doped regions arranged at four ends of the cross-shaped magnetism sensing portion.

What is claimed is:
1. A Hall sensor, comprising:
a semiconductor substrate;
a Hall element arranged on the semiconductor substrate, the Hall element having four sides and four vertices;
two pairs of terminals arranged on the Hall element, the two pairs of terminals serving both as control current input terminals and Hall voltage output terminals;
an element arranged on the semiconductor substrate outside the Hall element, the element serving as a heat source; and a plurality of temperature sensors arranged on the semiconductor substrate outside the Hall element, the plurality of temperature sensors being different from the element, and respective ones of the plurality of temperature sensors being arranged along respective ones of the four sides or in a vicinity of respective ones of the four vertices of the Hall element, wherein the two pairs of terminals are arranged so that one of the two pairs of terminals has a first Hall element control current flowing therebetween and another of the two pairs of terminals has a second Hall element control current flowing therebetween, and the first Hall element control current and the second Hall element control current cross each other as vectors, and wherein a vector sum of the first Hall element control current and the second Hall element control current is parallel to a straight line connecting between a maximum value and a minimum value of temperatures measured by the plurality of temperature sensors.

2. A Hall sensor according to claim 1, wherein the Hall element has a square shape in plan view.

3. A Hall sensor according to claim 1, wherein the Hall element has a cross shape in plan view.

4. A compensation method for an offset caused by a temperature of a Hall sensor, the Hall sensor comprising:
a semiconductor substrate;
a Hall element arranged on the semiconductor substrate, the Hall element having four sides and four vertices;
two pairs of terminals arranged on the Hall element, the two pairs of terminals serving both as control current input terminals and Hall voltage output terminals;
an element arranged on the semiconductor substrate outside the Hall element, the element serving as a heat source; and
a plurality of temperature sensors arranged on the semiconductor substrate outside the Hall element, the plurality of temperature sensors being different from the element, and respective ones of the plurality of temperature sensors being arranged along respective ones of the four sides or in a vicinity of respective ones of the four vertices of the Hall element,
one of the two pairs of terminals having a first Hall element control current flowing therebetween and another of the two pairs of terminals having a second Hall element control current flowing therebetween, the first Hall element control current and the second Hall element control current crossing each other as vectors, the compensation method comprising:
setting the first Hall element control current and the second Hall element control current so that a vector sum of the first Hall element control current and the second Hall element control current is parallel with a straight line connecting between a maximum value and a minimum value out of temperatures measured by the plurality of temperature sensors, to thereby eliminate the offset.

5. A Hall sensor, comprising:
a semiconductor substrate;
a Hall element arranged on the semiconductor substrate, the Hall element having four axes of symmetry in plan view;
two pairs of terminals arranged on the Hall element, the two pairs of terminals serving both as control current input terminals and Hall voltage output terminals;
an element arranged on the semiconductor substrate outside the Hall element, the element serving as a heat source; and
a plurality of temperature sensors arranged on the semiconductor substrate around the outside of the Hall element, the plurality of temperature sensors being different from the element serving as a heat source, and the plurality of temperature sensors collectively having four axes of symmetry in plan view,
wherein the two pairs of terminals are arranged so that one of the two pairs of terminals has a first Hall element control current flowing therebetween and another of the two pairs of terminals has a second Hall element control current flowing therebetween, and the first Hall element control current and the second Hall element control current cross each other as vectors, and
wherein a vector sum of the first Hall element control current and the second Hall element control current is parallel to a straight line connecting between a maximum value and a minimum value from among temperatures measured by the plurality of temperature sensors.

6. A Hall sensor according to claim 5; wherein the Hall element has a square shape in plan view.

7. A Hall sensor according to claim 5; wherein the Hall element has a cross shape in plan view.

* * * * *